US006384540B1

(12) United States Patent
Porter, Jr. et al.

(10) Patent No.: US 6,384,540 B1
(45) Date of Patent: May 7, 2002

(54) SYSTEM FOR HIGH POWER RF PLASMA PROCESSING

(75) Inventors: Robert M. Porter, Jr.; Anatoli V. Ledenev; Gennady G. Gurov, all of Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 09/380,002

(22) PCT Filed: Feb. 24, 1998

(86) PCT No.: PCT/US98/03564

§ 371 Date: Nov. 24, 1999

§ 102(e) Date: Nov. 24, 1999

(87) PCT Pub. No.: WO99/10181

PCT Pub. Date: Mar. 4, 1999

Related U.S. Application Data

(63) Continuation-in-part of application No. 08/805,608, filed on Feb. 24, 1997, now abandoned.

(30) Foreign Application Priority Data

Aug. 21, 1997 (JP) .............................................. 9-240398
Dec. 22, 1997 (JP) .............................................. 9-365513

(51) Int. Cl.$^7$ ................................................. H03F 1/36
(52) U.S. Cl. ............................. 315/111.51; 330/124 R; 330/207 A
(58) Field of Search ....................... 330/71, 74, 124 R, 330/207 A, 251, 295; 315/111.51

(56) References Cited

U.S. PATENT DOCUMENTS

| 3,445,782 | A | 5/1969 | Sonkin | .................... 330/124 R |
| 4,383,203 | A | 5/1983 | Stanley | ............... 330/207 A X |
| 4,590,436 | A | 5/1986 | Butler et al. | ............ 330/295 X |
| 4,590,437 | A | 5/1986 | Butler et al. | ............ 330/295 X |
| 4,631,493 | A | 12/1986 | Vendelin et al. | ........ 330/295 X |
| 4,980,810 | A | 12/1990 | McClanahan et al. | ........ 363/16 |
| 5,118,997 | A | 6/1992 | El-Hamamsy | .......... 330/251 X |
| 5,121,084 | A | 6/1992 | Anderson et al. | ........... 330/295 |
| 5,306,986 | A | 4/1994 | Siao | ....................... 330/251 X |

FOREIGN PATENT DOCUMENTS

| DE | 4438463 C1 | 2/1996 | ............ H05H/1/46 |
| WO | WO 93/21685 | 10/1993 | |

OTHER PUBLICATIONS

"RF Device Data", vol. 2; Motorola 1990.

Benjamin, "Use Hybrid Junctions For More VHF Power," Electrical Design 16, pp. 54–59; 08/68.

Johnson, "Solid–State Amplifier Delivers Reliable Meteor–Burst Communication," MSN & CT, pp. 8, 9, 12, 16; 09/87.

(List continued on next page.)

Primary Examiner—Michael B Shingleton
(74) Attorney, Agent, or Firm—Santangelo Law Offices, P.C.

(57) ABSTRACT

A high power radio frequency power method of amplifications described in which a variety of amplifiers (60 & 86) may be used to reduce the stress any one amplifier experiences. The power leads (64 & 65) may be arranged in a series to power each amplifier at potentials which are lower than the total potential. Outputs (63) may then be connected in a parallel fashion to combine the power output by the system. A variety of unique stabilization, drive, division, combination, and supply configurations are presented as well as the possibility of utilization and adaptation of the designs for a plasma processing system. An aspect of tiered combining is included such as may be especially appropriate for larger numbers of devices which may include switch-mode amplifiers and the like.

40 Claims, 12 Drawing Sheets

OTHER PUBLICATIONS

Niclas, "Planar Power Combining For Medium Power GaAs FET Amplifiers in X/Ku–Bands," Microwave Journal vol. 22, No. 6, pp. 79–84; 06/79.

Whittaker, et al., "The Design, Evaluation & Modelling of a UHF Power Amplifier for a Mobile Satellite Transponder," IEEE International Conference on Communications '86, vol. 3/3, Jun. 22–25, 1986, Toronto, Canada.

Peterson, et al., "30–V MMIC Power Amplifier with Novel Bias Circuitry*," MTT–S International Microwave Symposium Digest, Boston Jun. 10–14, 1991, vol. II, Jun. 10, 1991, Heiter, G. L.

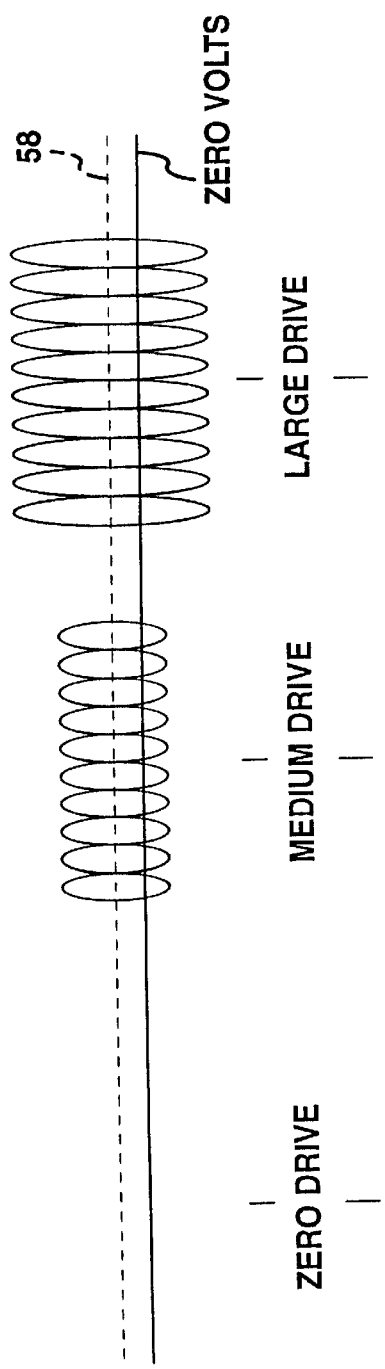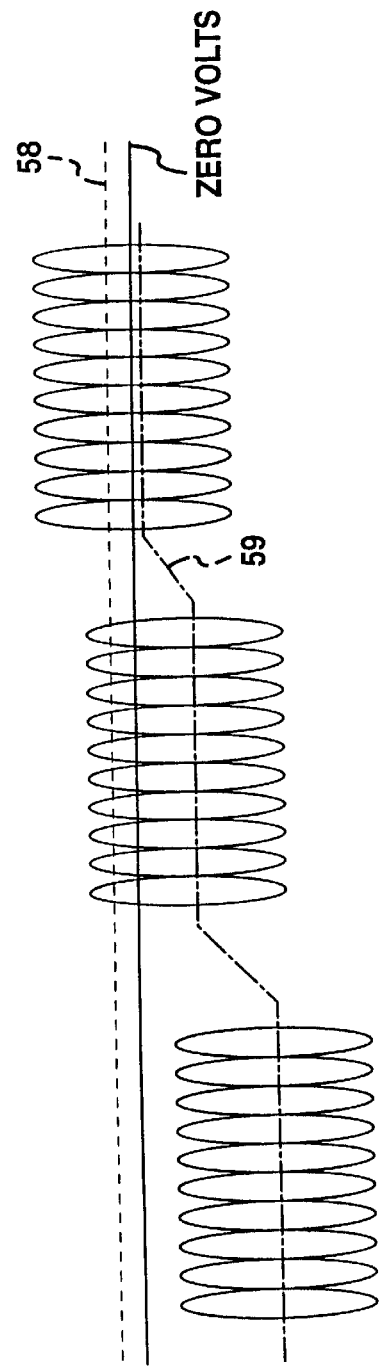
FIG.4a PRIOR ART
FIG.4b

SYSTEM FOR HIGH POWER RF PLASMA PROCESSING

This application is a National Stage Application of International Patent Application No. PCT/US98/03564, filed Feb. 24, 1998, which is a continuation-in-part of U.S. patent application Ser. No. 08/805,608, filed Feb. 24, 1997, now abandoned, and claims the benefit thereof.

I. TECHNICAL FIELD

This invention generally relates to radio frequency generators which accept a power such as a dc potential and convert that power into a radio frequency, higher power output. More particularly it relates to such generators which produce power which are considered especially high when compared to those typically created from a particular type of component or particular design. The invention also may involve enhanced systems and processes (including plasma processing systems, and the like) which may include a variety of ancillary features such as these higher power generators, system specific elements, or unique processes.

Definitions

Approximately Equal

In this context, voltages, currents, impedances, or other quantities are approximately equal if the differences between them are not significant in the context of the particular application or the particular design or componentry involved and, as such, do not cause an effect which is so different in that context as to make the desired end result ineffective or unsuited to the intended purpose.

Biasing

Supplying a signal, to a circuit to establish an operating point for the low frequency impedance. This signal might comprise a variety of properties, including at least a dc voltage, or a dc current, or an alternating voltage or current at any frequency.

Bias Voltage

The name given a biasing signal if it constitutes a voltage.

Bus Power

The power provided to a power amplifier circuit which is to be converted by that circuit to radio frequency power.

Bus Voltage

The voltage provided by the bus power circuit.

Combiner

An element which achieves combining.

Combining

Utilizing together the signals of a plurality of devices, such as power amplifiers to produce one or more higher power signals. The combining may be done by transformer action, by the simple summing of currents into one or more common nodes, or any other appropriate mechanism. It would include (but not be limited to) such utilization as adding, combining, summing, or totaling.

Combining Circuitry

Any element or collection of elements which cause combining, such as from power amplifiers or from other combining circuitry.

Common Electrical Point

An electrical location, such as a node or a collection of locations in an electrical circuit which receives currents or power from other locations or nodes. The common electrical point may, through the action of one or more combiners or other circuit elements act to achieve combining.

Dividing a Potential

Causing, by any mechanism, a potential to be shared among a plurality of elements. The sharing may be even, such that each element has impressed across it substantially the same potential, or it may be uneven; in a power supply context, the concept includes that the circuit is so arranged that each load has impressed across it less than the total power supply potential.

Electromagnetic Coupling Element

An element of a plasma system which is used to couple radio frequency power to a plasma.

Establishing a Low Frequency Impedance

Creating a low frequency impedance for a circuit or collection of components through any available mechanism, including but not limited to the selection of components, varying of component values, or biasing of active elements.

Radio Frequency

An electrical alternation rate high enough that the inductance and capacitance of ordinary connection elements becomes significant. This may include at least any frequency between the broad limits of 300 kHz to 500 MHZ, and may even focus on the ISM frequencies allocated by the FCC for use by equipment designed for the Industrial, Scientific, and Medical fields, or even more specifically the frequencies of 6.78 MHz, 13.56 MHz, 27.12 MHz, or 40.68 MHz.

Radio Frequency Drive Signal

A signal which alternates at a radio frequency and which is applied to the control element of a transistor or switch element to cause the transistor to vary in conductance, or to cause the switch element to transition from an "ON" state to an "OFF" state.

High Power

A level of power too large to reasonably obtain from a low voltage single phase power line; in one context any power over about 100 watts would be considered "high", and may even focus on the several-kilowatt range, or even more specifically 1 to 10 kW.

Impressing a Potential

In this context, arranging a circuit so that a potential appears across the object. That is, the object is subjected to the impressed potential. This might be done in a variety of ways, including at least by direct connection to the potential or by an indirect method such as passing a current through the object to create the potential.

In-Phase Components

Two signals are said to be in phase if the difference in the instants of their starting and ending alternations is small compared to their period of alternation. Two signals which are not in phase can be mathematically decomposed into fractions which are in phase and fractions which have alternations shifted by one-quarter of a period; the former are called the "in-phase components".

Low Frequency Impedance

The ratio of voltage across an object to the current through it, measured at a frequency below the radio frequency definition.

Phase a) The fraction of a complete cycle of an alternating signal elapsed as measured from a specified reference point; often expressed as an angle, or b) one of a multiple of power leads in a multi-phase supply system.

Series String

A connection between a plurality of elements made such that substantially most of the current from each must pass through each of the others.

Single Phase Power

A system of power distribution utilizing two wires, such as a feed wire and a return wire, between which exists an alternating voltage. Single phase power systems are often used in domestic and office environments wherein low powers are required, and may be contrasted with multi-phase power systems, which have at least three wires and are often used in high power industrial environments.

Switchmode

A circuit in which the main power element is predominately in either an "ON" state, wherein the voltage across the element is small compared to the "OFF" state voltage; or in an "OFF" state, wherein the current passing through the element is small compared to the "ON" state current; and wherein a condition of simultaneous substantial voltage and current is transient.

Tiered Combiner

An element which effects tiered combining.

Tiered Combining

Utilizing together the outputs of a first grouping of devices, such as power amplifiers into a first group (which may be termed level one), followed by combining the outputs of the first group into a second group (level two), continuing (if necessary and desired) until one or more final outputs are formed. The groupings may be in threes, fours or any other grouping, but are commonly in pairs. For example, eight amplifier outputs may be combined in pairs at level one into four nodes, the four nodes combined in pairs at level two into two nodes, and these last two combined in pairs at a third level into a single output. In this example, the level two outputs could be left separate as dual independent outputs without violating the concept of tiered combining.

II. BACKGROUND

Originally, except for some early use in diathermy machines, high power radio frequency generators were used principally as sources of energy for radio frequency transmitters. Today, operating at frequencies from about 100 kHz to about 500 MHZ, radio frequency generators are widely used for plasma processing, as well as the energy source for lasers, high frequency lighting, and dielectric heating or sealing equipment, and for providing the accelerating potential in electron and ion accelerators.

Virtually all radio frequency generators for these purposes employ an element which converts direct current (dc) power, or steady voltage, to radio frequency power. This element is called an "inverter" or "converter" at lower frequencies, but at higher frequencies it is often termed a Power Amplifier, or PA, for historical reasons. Note that as used here the term "amplifier" includes, but is not limited to, circuits, such as switchmode "amplifiers", which may not literally "amplify" in the sense of producing a higher power replica of an input signal. Some such circuits may simply have power leads, across which is impressed the dc potential conveying the dc input power; input terminals, across which is placed the input, or drive signal; and output terminals, across which appear the output power. The power leads could also carry non-dc power in its strictest sense so long as power from such leads is converted by the amplifier.

In most of these uses, control is required of the amount of radio frequency power produced by the generator. To provide this control, a measurement element is used to measure the output of the generator, the output of this element is compared to a desired value, and a control element which controls the output power is signaled to increase or decrease the output power to achieve the desired value.

Designers of radio frequency generation equipment have taken two approaches in the design of the control element used to control the power; usually only one is used in any given piece of equipment. The first approach controls the input, or "drive", signal to the Power Amplifier (PA) in the generator. In this case the dc power to the PA (sometimes called the "bus" power) is held constant. In the second approach the drive signal to the PA is held constant and the voltage of the bus power (the "bus voltage") is varied as required to produce the desired output power. Such approaches for radio frequency designs may be considered distinct from the approaches often available in low frequency designs because the low frequency designs often have the advantage of not having to usually include the lead inductance and the like of ordinary connection elements. In fact, this aspect has resulted in designers recognizing a distinction, namely, that the techniques of low frequency design often do not work in the radio frequency field. As but one example, it may even be considered that concepts such as floating an amplifier or the like may be often avoided in the radio frequency field since parasitic elements can significantly alter the actual effect achieved.

In the radio frequency field, generally the former approach (varying the drive signal) is less expensive to implement, because providing a variable voltage dc power supply for the PA bus is more costly than providing for a variable drive signal. Most transistors suitable for radio frequency cannot withstand very high voltages, however, and this limits the maximum bus voltage. In generators to be used at low power levels—a few tens of watts—and in the United States or Japan, it is possible to rectify the 120 or 100 volt mains power directly to provide the bus voltage, but at higher power levels, or for European use, one must design for higher mains voltages. Direct rectification of US industrial and European mains voltages produces nominal dc bus voltages of 300 and 570 volts respectively, and under common conditions these values can be exceeded by 10–15%. It should also be noted that the radio frequency signals across the transistors exceed the actual dc supply voltage by an amount which depends upon the circuit configuration; in many common circuits the peak RF voltage across the transistor can be more than three times the dc supply potential. Finally, transients occur in some applications which further add to the total voltage appearing across the transistor. All of these effects add to produce peak voltage levels which can be too large for typical radio frequency transistors to withstand.

In addition to these problems related to the transistors, in the commonly used "push-pull" circuits a transformer is utilized which typically contains ferrite cores, and the losses in these cores can become unmanageable at high dc supply potentials.

As a result, transformers are usually placed in the power line to reduce the voltage prior to rectification, permitting lower, safe peak voltages on the transistors. These transformers are heavy and bulky in high power circuits which we here define as those over about 100 watts. It is principally the bulk and weight of the transformer that gives rise to the second approach, use of a switchmode dc power converter. A switchmode dc power converter can be made which may operate from the directly rectified power mains and which may produce an appropriately reduced voltage, and such a power converter can be made small and light in weight. Such power converters are usually costly due to their complexity and this constitutes a disadvantage. Since a switchmode dc power converter intrinsically contains the circuitry to vary its output, however, once the designer has made the choice to incorporate such a costly element, the second power control approach becomes feasible at little or no additional cost. This second power control approach does solve another problem found in the fixed voltage method first described, which is that with a fixed power supply the power dissipation in the transistor devices can become excessive into some mismatched loads. For this reason, control circuitry can be commonly added to fixed voltage designs to limit the open circuit voltage or short circuit current in order protect the transistor devices from damage. In the second power control approach the power dissipation in the transistor devices is reduced into mismatched loads because the power supply voltage can be lowered to protect the transistor devices. The effect of this is an ability on the part of a generator designed with a variable power source to deliver more open circuit voltage or short circuit current than would be possible with a fixed voltage power source, given the same number of transistors with the same power dissipation ratings in each. This additional ability can be important in plasma powering applications and the like, because ignition of the plasma can often require significant open circuit voltage from the radio frequency generator.

So heretofore the designer of such high power radio frequency generation equipment has in many cases been faced with the following dilemma: accept the large and heavy result of incorporation of a line transformer or incorporate a switchmode power converter with its high cost. This dilemma can exist regardless of the need to control the output of the equipment.

The present invention may be considered to skirt this dilemma. It demonstrates one way to create a circuit configuration which causes the high voltage of the directly rectified power mains to be shared among two or more Power Amplifiers. This can permit the complete elimination of the bulky and heavy power transformer and the alternative of the costly voltage-reducing switchmode power converter. This may be considered a fundamentally simple concept and can be used with low frequency power supplies. But what is surprising is that this concept can be applied at radio frequency with simple circuit configurations. It is a measure of their nonobviousness that the present invention has lain undiscovered in the face of the above dilemma, in spite of years of development of the radio frequency power generator. In fact, many currently available commercial products could be significantly cost-reduced by following the teachings of the present invention.

To make this point clearer, it has been common for a high power radio frequency generator to be composed of a number of Power Amplifiers, each producing a fraction of the total output power. This has been done because, until recently, semiconducting transistors capable of producing powers much above about 300 watts were not practically available, and those that exist may require special circuits to make use of them. Thus such generators producing over a few hundred watts have used several Power Amplifiers with their outputs added, or combined, to produce the total power required. In all commercial generators in production today, these amplifiers are usually powered by a single low voltage dc supply, produced by a transformer or switchmode dc power converter. In several of these units, a simple reconnection of the power leads of the amplifiers in accordance with the invention herein disclosed would have permitted complete elimination of the transformer, which in turn would have significantly lowered the size and weight of the unit and, importantly, the cost of manufacture. That this has not been done for these designs, many of which have been on the market in their present form for over a decade, is an indication that those skilled in the art have heretofore failed to appreciate the possibilities for solution of this problem, and is a further indication of the nonobviousness of the present invention.

III. DISCLOSURE OF THE INVENTION

It is an object of this invention to provide a cost effective, reliable, simple design for a plasma power generator.

It is a further object of the present invention to provide a design which affords manufacturing and commercial advantages. In keeping with this object it is a goal to provide a design which eliminates the need for power conversion components in the dc power supply to the radio frequency Power Amplifier or inverter.

It is also a general object of the present invention to provide a design for a radio frequency power generator which is simple and cost-effective. In keeping with this object it is a goal to reduce the complexity and number of components in the power generation circuitry, and to provide a design which can utilize low cost high frequency transistors while providing a high power radio frequency output.

It is a further object of the present invention to provide a design for a high power radio frequency generator which can be smaller and lighter in weight than prior art generators. Naturally, this may enhance the scope of application of such generators.

It is an additional object of the present invention to provide a design for a high power radio frequency generator which is more reliable than prior art generators. The present invention accomplishes this object by reducing the number and complexity of the power components, and also by reducing the voltage stress to which the key semiconductor elements are subjected.

It is yet a further objective of the present invention to provide a design for a high power radio frequency generator which can achieve stable yet faster control over its output power than was possible using prior art techniques.

The present invention also has the object of providing more stable performance into load impedances which are not at the design center for the amplifier, with less dissipation or energy loss than prior art designs. In addition, techniques are disclosed for providing more power into these sub-optimal load impedances. As heretofore mentioned, this can be important to achieve ignition in plasma powering applications.

It is yet another object of the present invention to provide a design for a variable frequency high power radio frequency generator which is capable of delivering high power into a single adjustable tuned circuit, which permits easier and more accurate tuning than in prior art designs which use multiple tuned circuits.

Accordingly, the present invention provides novel designs which utilize directly rectified mains power in powering relatively lower voltage Power Amplifiers, and may thus eliminate both the bulky and heavy line transformer and the alternative costly switchmode power converter. In one embodiment, it may do this by arranging the circuits so that the rectified mains voltage (the "bus" power) is divided among a number of PA units. The present invention also discloses a method of providing drive to the PA units which is not only simple but provides more output power for each PA unit than prior art drive techniques. The present invention also discloses methods of providing power connections to the PA units with the property of stabilizing the PA against spurious oscillations. The present invention also discloses simple methods of combining, summing, or adding together, output signals from a plurality of amplifiers, and discloses how such a plurality of amplifiers can be arranged to drive a single output tuned circuit so that tuning of the combined array is made simple and easy. Finally, a method is presented to permit higher open circuit voltage and short circuit current from a radio frequency generator operated from a fixed-voltage power source.

IV. BRIEF DESCRIPTIONS OF THE DRAWINGS

FIG. 1a shows a transformer/rectifier input circuit and FIG. 1b shows a switchmode converter input.

FIG. 4 shows waveforms which may be used to drive the power amplifiers.

FIG. 4a shows the drive waveforms for the prior art;

FIG. 4b shows some drive waveforms as disclosed for the present invention,

Figure 7:
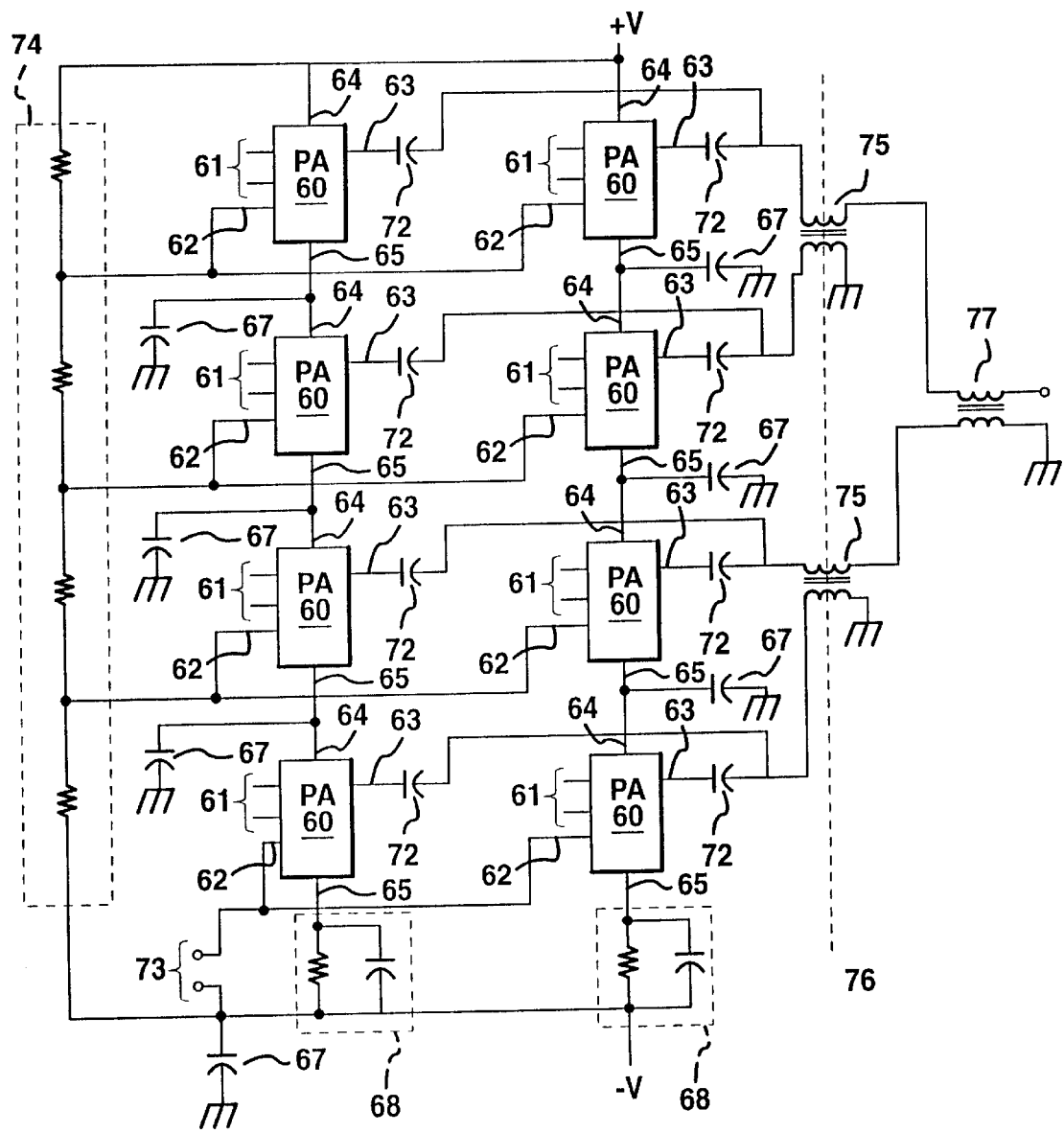

FIG. 7 indicates an alternative way of connecting eight PA units in a series/parallel supply voltage arrangement, wherein each PA unit has impressed upon it one-fourth of the power supply voltage, and wherein the outputs are combined using tiered combining.

Figure 8:
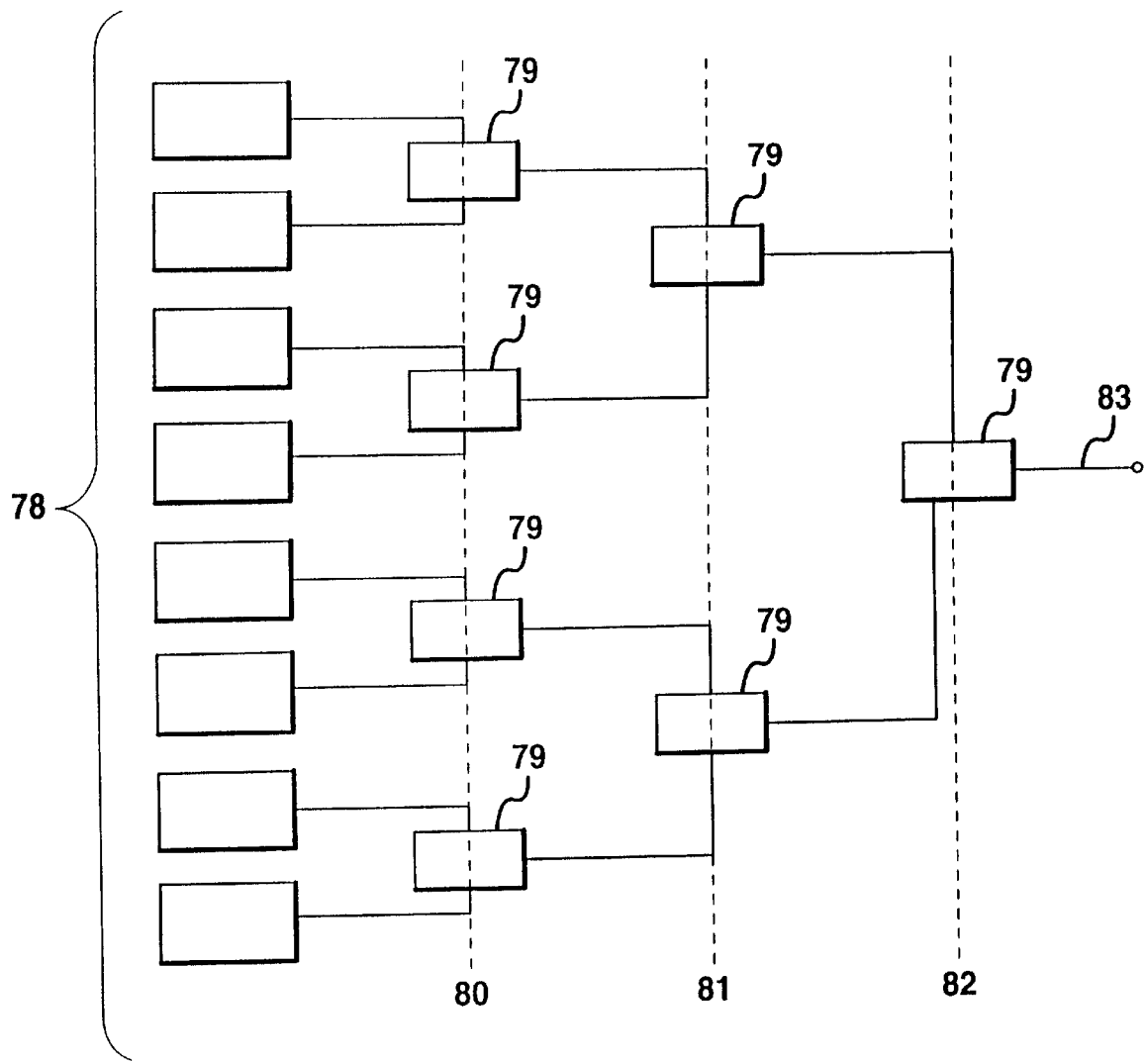

FIG. 8 shows one more general method of tiered combining of PA outputs.

Figure 8B:
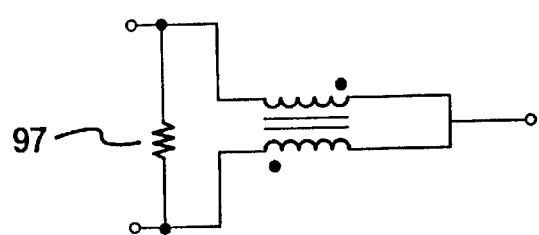

FIG. 8b shows one embodiment of combiner unit for a pair of PA outputs.

Figure 9:
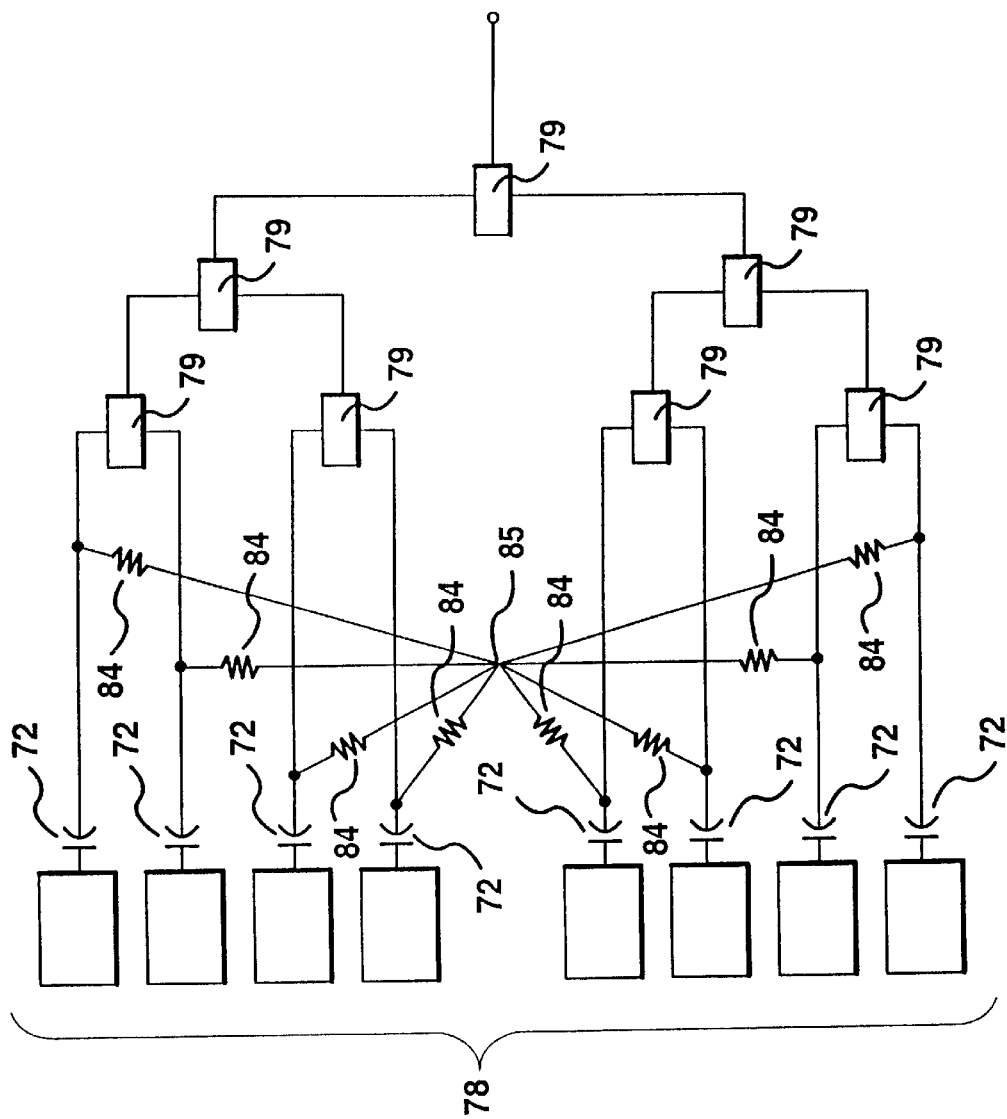

FIG. 9 shows an alternate method of stabilization using a star configuration of resistors.

Figure 10:
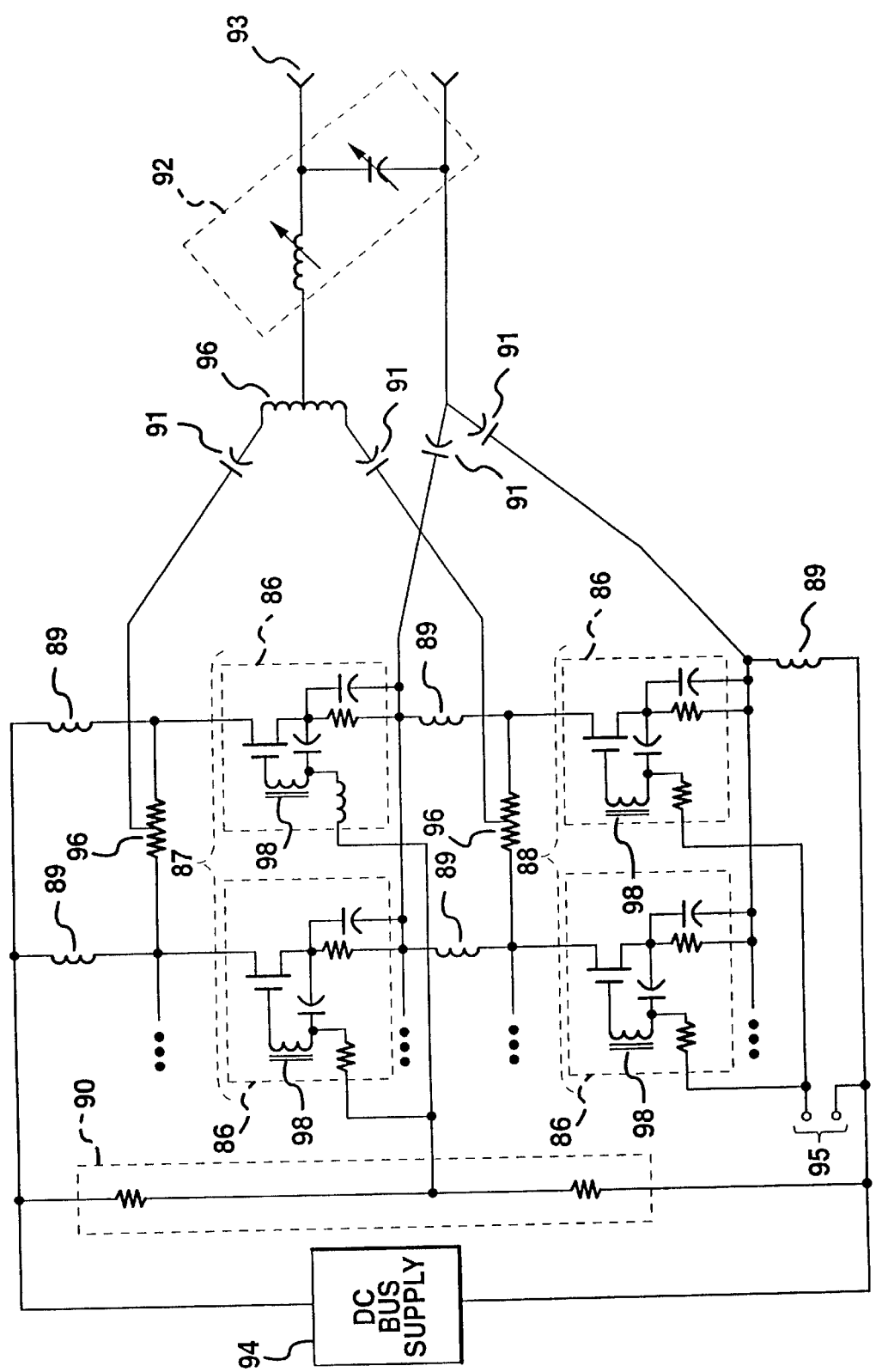

FIG. 10 depicts a circuit using a plurality of PA units combined into a single tunable resonant circuit.

Figure 11:
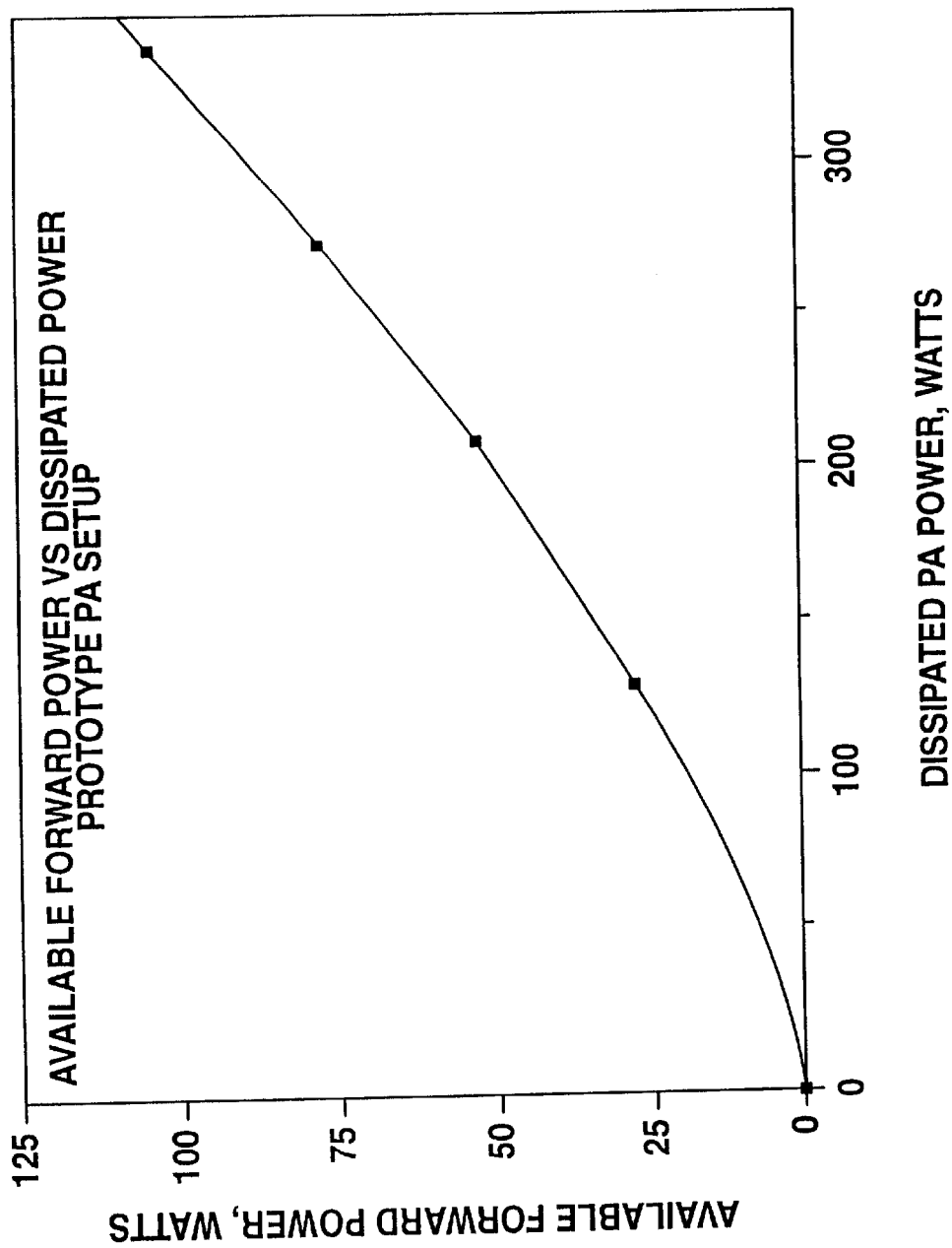

FIG. 11 is a graph of the available forward power from a radio frequency generator into a mismatched load, as a function of the total device dissipation in the generator's transistor devices.

V. BEST MODES FOR CARRYING OUT THE INVENTION

As mentioned above, the present invention presents improved circuits and circuit configurations for production of radio frequency high power signals. This may be most easily seen by comparison to the prior art. In the prior art, the incoming mains power supply is reduced in voltage to be compatible with the lower voltage capability of the power amplifying devices. As has been said, this can be accomplished in several ways, two of which are shown in FIG. 1.

Figure 1A:
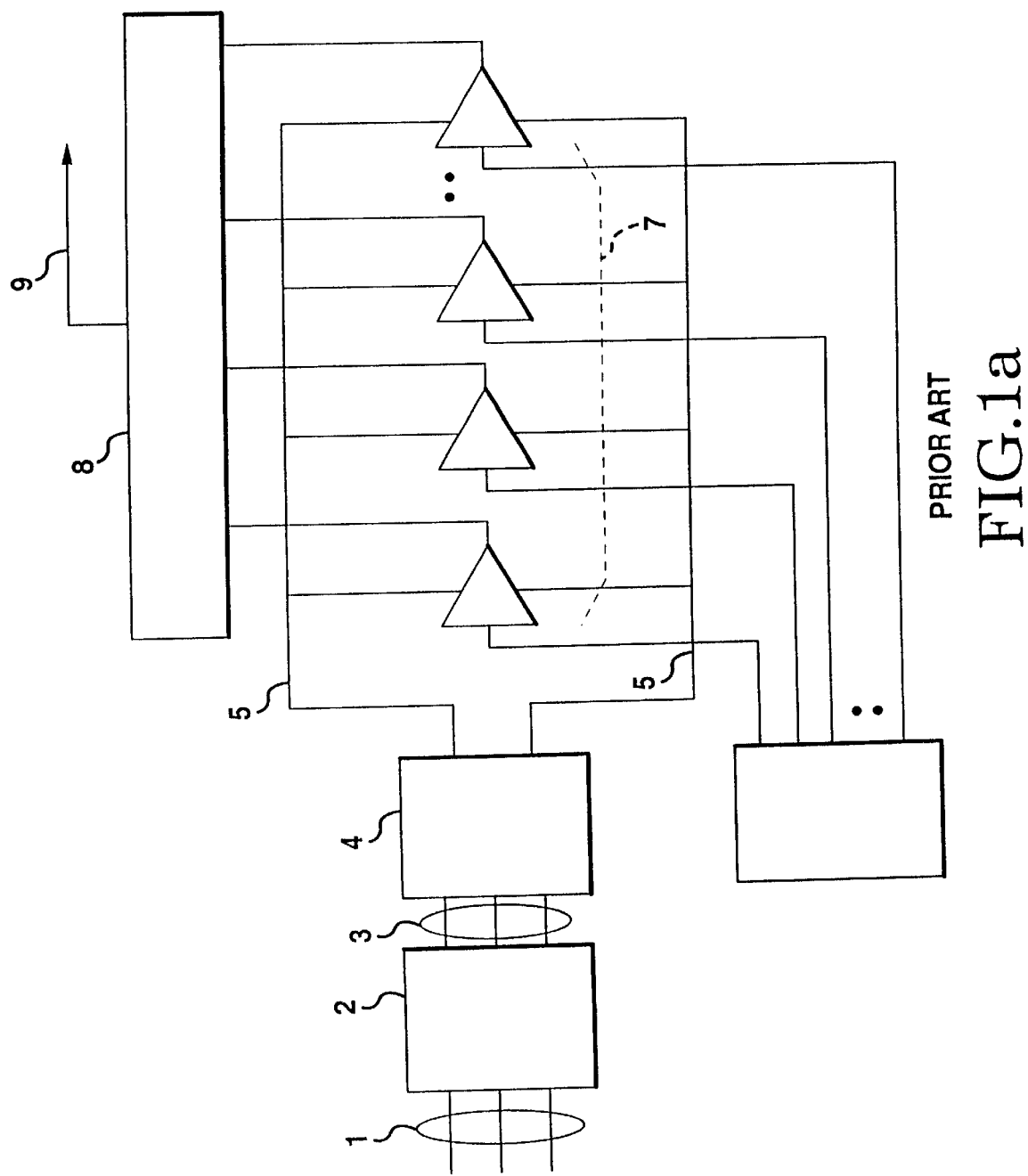
FIGS. 1a and 1b are block diagrams of radio frequency high power generators in the usual configuration of the prior art.

FIG. 1a shows a common basic configuration of the prior art. Power from the incoming supply 1 (such as the mains supply) is transformed by transformer 2 to a lower alternating voltage 3. This lower voltage 3 is converted to dc bus voltage 5 by AC-DC converter 4. This bus voltage 5 is supplied to a plurality of power amplifiers (PAs) 7, by parallel connection. That is, each of the plurality of PA units 7 is supplied the same bus voltage 5. Naturally, there may be in some cases only a single PA unit, but if higher powers are required, commonly a plurality of PA units are provided and a combiner 8 used to combine their individual radio frequency outputs to form the required higher power at output 9 as shown in FIG. 1a. As those of ordinary skill in the art of plasma processing understand, in such applications, this output 9 may be then be coupled electromagnetically through some element such as an inductor design or a cathode/anode design or the like to create a plasma in some plasma element, such as a chamber or the like. Again, each of these elements is shown in the references, is well known, and can be varied significantly to suit the particular application.

Alternatively, referring now to FIG. 1b, power from the incoming supply 1 (such as the mains supply) is converted to dc voltage 11 by AC-DC converter 10 and subsequently transformed to a controlled lower bus voltage 5 by DC-DC converter 12 for use by the plurality of PA units 7. Again, as those skilled in the art will recognize, it is possible that only a single PA unit could be utilized, but when higher powers are required, it is common to provide a plurality of PA units 7 whose outputs are combined by combiner 8 to form the required power at output 9 as shown in FIG. 1b.

Figure 1B:
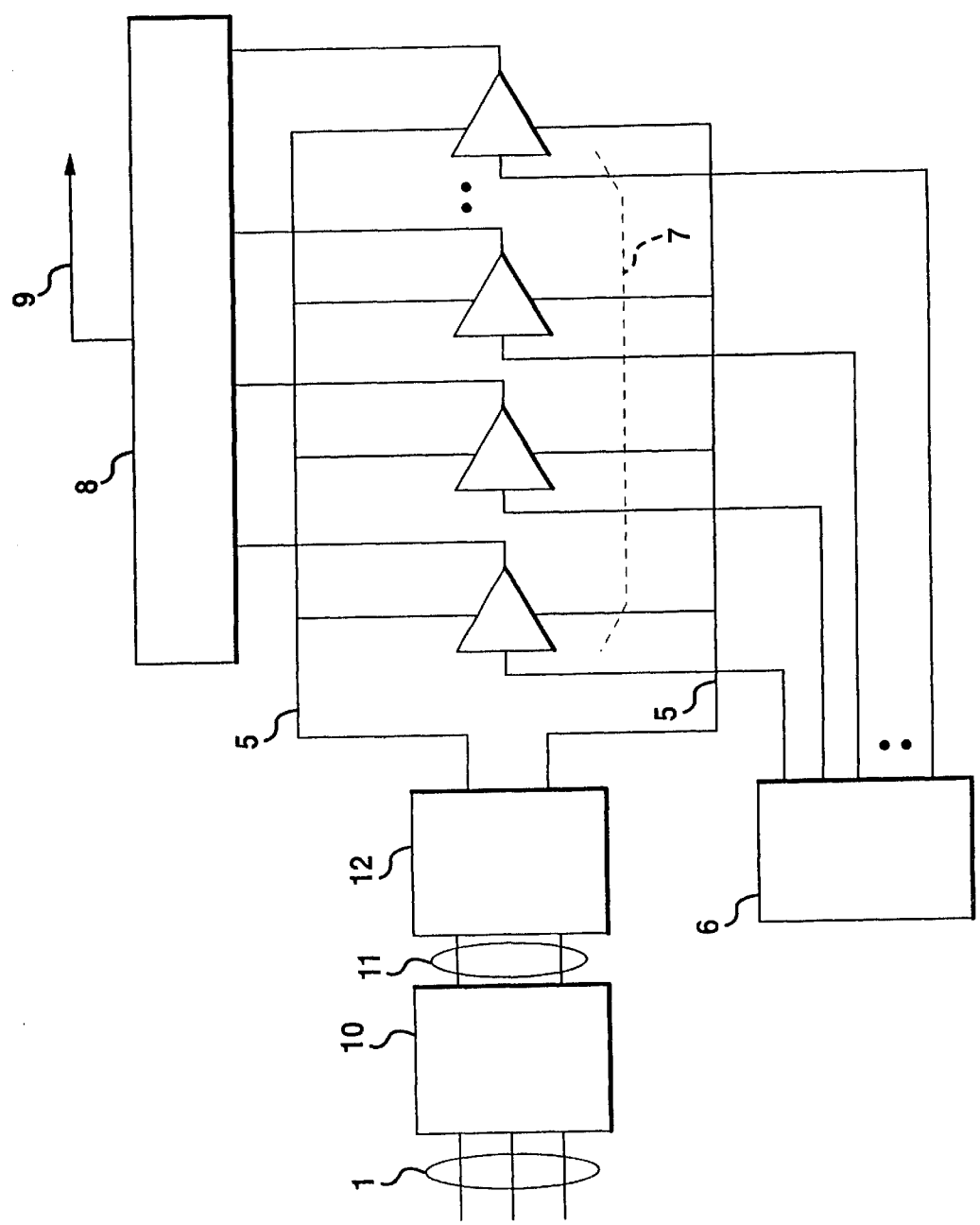

Not shown in FIGS. 1a or 1b is the means for control of the output power; as those skilled in the art will know, this may be done in the configuration of FIG. 1a by control of the drive signal to the PA units through control of radio frequency driver 6 by means not shown in the figure. In the configuration of FIG. 1b, control is commonly done by adjustment of the bus voltage 5 through control of the DC-DC converter 12 by means not shown in the figure, but control of the output power could as well be through control of radio frequency driver 6, as in the former case.

Regardless of the approach, the fundamental concept in the prior art has been to produce a powering voltage for the PA units which may be less than the voltage nominally obtainable by direct rectification of the mains power. As will be recognized by those skilled in the art, this has been necessary because most transistors suitable for radio frequency cannot withstand the peak voltages which occur when the powering voltage is obtained by direct rectification of the power line. In generators to be used at low power levels in the United States or Japan, it is possible to rectify 100–120 volt mains power directly to provide a bus voltage of about 140–165 volts, but at higher power levels or for European use, one must design for higher mains voltages. Direct rectification of US industrial and European mains voltages produces nominal dc bus voltages of 300 and 571 volts respectively, which value is exceeded by 10–15% under "high line" conditions. In addition the radio frequency signals across the transistors can exceed the actual dc supply voltage by an amount which depends upon the circuit configuration; in many common circuits the peak RF voltage across the transistor can be more than three times the dc supply potential. Finally, transients occur in some applications which further add to the total voltage appearing across the transistor. All of these factors produce peak voltage levels which may be too large for typical radio frequency transistors to withstand if the nominal dc bus voltage is higher than about 200 volts. In using US industrial or European mains voltages, then, the prior art concept has been to reduce the powering bus voltage, either with a transformer or with a DC-DC converter, to levels which range from about 28 volts to about 200 volts.

The present invention avoids the requirement to reduce the powering bus voltage by placing the PA units in series so that the unreduced bus voltage is shared among a plurality of PA units. For the minimum case of two PA units, one way this is done in accordance with the teachings of the present invention may be seen in FIG. 2. PA unit 13 has its positive power lead 14 connected to the positive bus terminal 15 and its negative power lead 16 connected to positive power lead 17 of PA unit 18. Negative power lead 19 of PA unit 18 is connected to negative bus terminal 20 through parallel resistor-capacitor circuit 50. Thus PA unit 13 is in series with PA unit 18 from the point of view of the power supply formed by bus leads 15 and 20, and the voltage across each of the PA units 13 and 18 individually is less than, and must sum near to, the powering voltage between bus leads 15 and 20. It should be noted that, while FIG. 2 uses the field effect transistor symbol for the semiconducting devices, the teachings of the present invention apply equally well to other types of semiconducting or other devices, including bipolar transistors, as one example.

Because the PA units 13 and 18 are in series across the power supply, the power supply current through each must be roughly the same. This current in FIG. 2 passes sequentially through inductor 26, the inductor in resonant circuit 27, inductor 28, transistor 25, inductor 29, the inductor in resonant circuit 30, inductor 31, and transistor 32. If desired, to ensure that the powering voltage across the two PA units is also about the same, a resistive divider 21, formed by resistors 22 and 23, may be connected across the bus leads 15 and 20. This resistive divider may split the powering voltage equally or unequally, but in symmetrical circuits with two PA units, such as the circuit of FIG. 2, the two resistors 22 and 23 may be equal, producing a voltage at node 24 approximately halfway between that of positive power lead 15 and negative power lead 20. The divided voltage at node 24 is applied to the control lead of transistor 25 through an isolation element, shown here as resistor 33, and the secondary of transformer 34. The selection of the isolation element may vary depending on the requirements of the amplifier and the mode of operation. A control voltage 37 is applied to the control lead of transistor 32 through resistor 35 and the secondary of transformer 36. This control voltage, through the action of transistor 32, sets the current in transistor 32, and this current will flow sequentially through inductor 26, the inductor in resonant circuit 27, inductor 28, transistor 25, inductor 29, the inductor in resonant circuit 30, and inductor 31, as previously mentioned. The voltage established by the voltage divider 21, applied to the control lead of transistor 25, through transistor action sets the voltage at its source lead, which is the voltage at lead 16 of PA unit 13.

Thus the steady current flowing in the series path formed by inductor 26, the inductor in resonant circuit 27, inductor 28, transistor 25, inductor 29, the inductor in resonant circuit 30, inductor 31, and transistor 32 is established by the magnitude of the control voltage 37 acting on transistor 32, and independently the voltage at the midpoint of the two PA units 13 and 18, and therefore the voltage across PA unit 18, is established by the action of the voltage divider 21 and transistor 25. Typically in FIG. 2 the resistors 22 and 23 would be made equal, and in this case the voltages across PA units 13 and 18 would be approximately the same, and equal to half of the total supply voltage between terminals 15 and 20. While separate feedback circuitry could be provided to equalize the voltage across each device, the present arrangement uniquely uses the PA devices themselves for negative feedback to achieve equal division. The equal division creates the lowest voltage stress on the PA units, because if the division was unequal, one of the two PA units would have more than half of the total supply voltage across it. The addition of the parallel combination 50 of a resistor and a capacitor in series with the lower PA between circuit nodes 19 and 20 provides a small voltage which subtracts from the bias provided by control voltage 37; this makes the above mentioned power supply current much less dependent on the exact characteristics of the transistor 32, and serves to make the power supply current more uniform from PA unit to PA unit in circuits with a plurality of pairs of PA units. If only two units are connected together as shown in FIG. 2, this uniformity is less important and circuit 50 may be dispensed with.

The PA units 13 and 18 each are arranged to amplify the input signal provided at input terminals 38. The outputs of these PA units, at nodes 39 and 40 respectively, may be used independently or added together as shown in FIG. 2. In FIG. 2 the two outputs are added by connecting the two outputs in parallel through capacitors 41, 42, 43, and 44 to RF output terminals 45.

Figure 2:
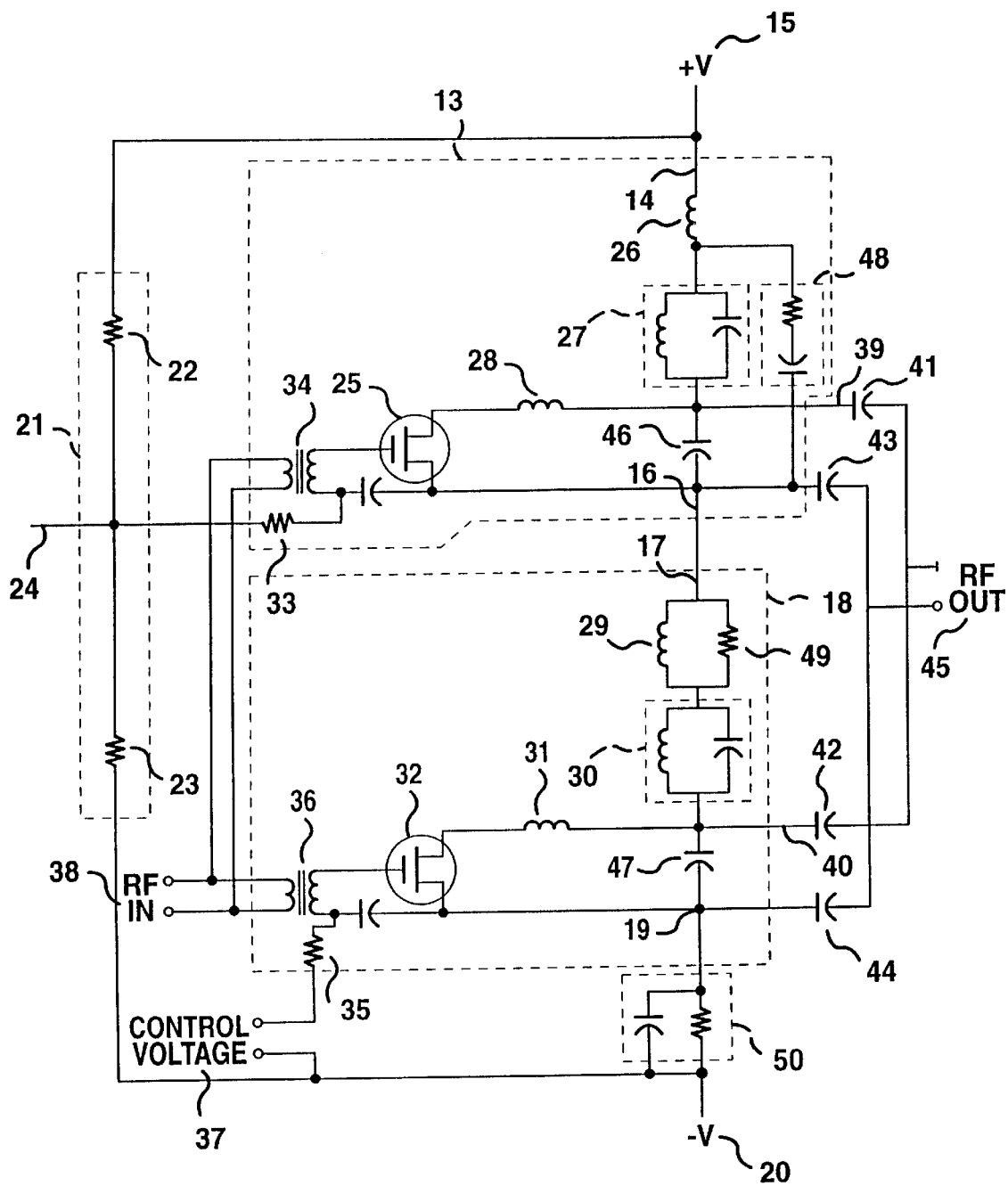
FIG. 2 is a detailed circuit diagram of one configuration according to the present invention, showing two PA units, and the circuit details resulting in sharing of the supply voltage, driving the PA units, and the stabilizing power connections.

To summarize what has been indicated so far, FIG. 2 shows two PA units. Their power leads are connected in series, which lowers the total voltage impressed upon the individual PA units, while their inputs and outputs are connected in parallel, permitting their powers to be added together at the output. The circuit in FIG. 2 is arranged to control the voltage across each of the two PA units to be approximately the same and roughly equal to half of the supply voltage. It will be understood by those skilled in the art that there are other possible circuit configurations and connections capable of achieving this voltage division. In this context it should be understood that FIG. 2 is intended to show a preferred embodiment and not all possible ways of achieving this basic objective of the invention, and in fact some of these other embodiments will be shown later in this application.

Figure 3:
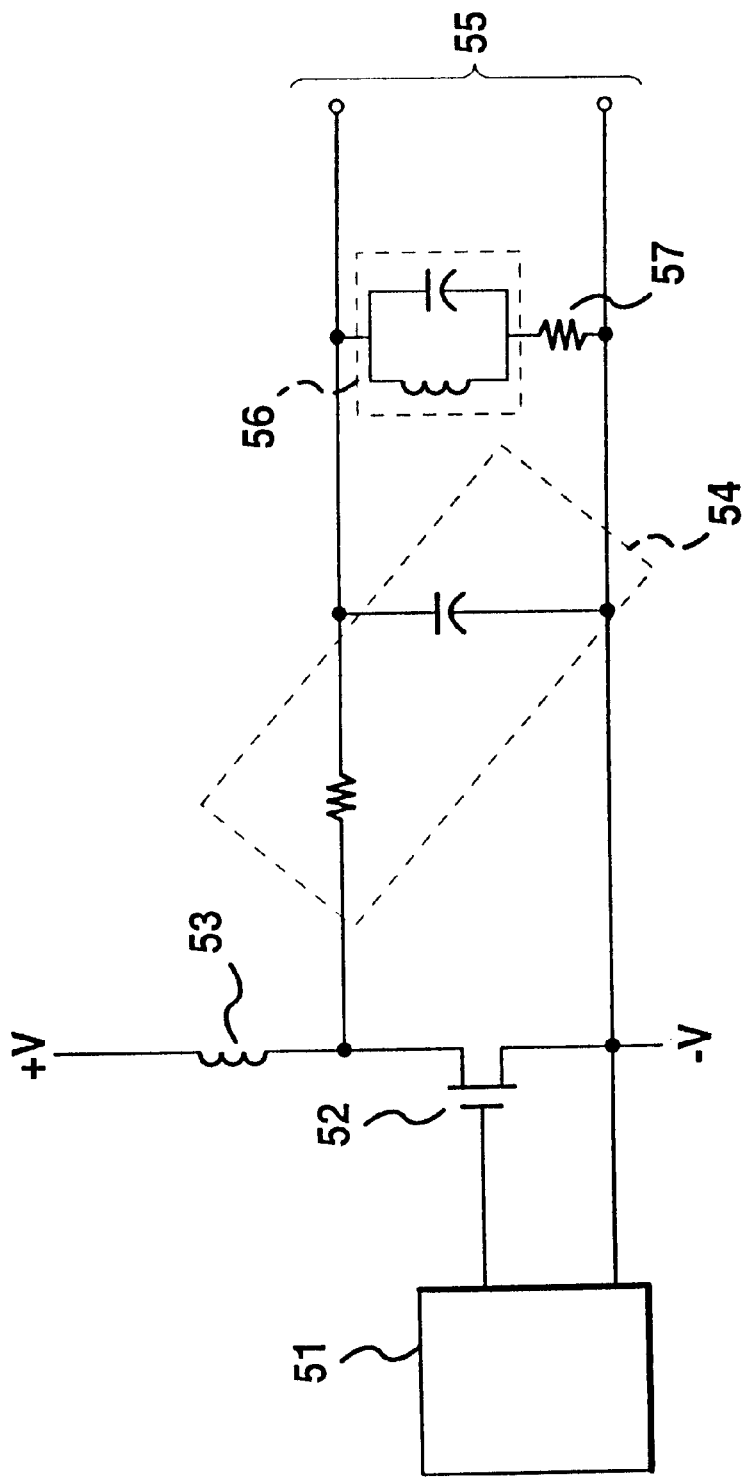
FIG. 3 shows one form of power connection to switchmode PA units in the prior art.

In addition to the concept of dividing the bus voltage among more than one PA unit, the present application also discloses a novel way of connecting the bus power to any PA unit. This will be seen by comparing FIG. 2 and FIG. 3; the latter shows one form of prior art power connections to switchmode PA units, in accordance with the teachings of U.S. Pat. No. 5,187,580, "High Power Switch-mode Radio Frequency Amplifier Method and Apparatus", incorporated herein by reference. In FIG. 3, switchmode drive element 51 causes transistor 52 to be either ON (highly conducting with very little voltage across it) or OFF (non-conducting with very little current through it). PA designs with such drive circuits are called switchmode because the transistor 52 acts like a switch as opposed to a variable conductance. Such designs are popular because they are highly efficient, as very little power is dissipated in either state of transistor 52. This means, however, that the waveform at the drain terminals of the transistor 52 is nonsinusoidal. For this reason filter 54 is used to remove the harmonic content of the drain waveform of transistor 52 to prevent it from reaching output 55. To feed power to the circuit, radio frequency choke 53 is used. Roughly the entire radio frequency voltage appears across choke 53 and basically the full power supply current passes through it, and it should therefore have low resistance and substantial inductance, typically several microhenries. To obtain such inductances in physically small inductors one generally uses ferrite cores, and substantial losses can be sustained in these cores, especially if they must support any substantial rf induction, which is the case in the circuit FIG. 3. If, for example, the waveform at the drain lead of transistor 52 has an amplitude of 200 volts and a frequency of 13.57 MHz, and if choke 53 has a value of 2.5 microhenries, all reasonable values, the radio frequency current flowing in the choke 53 (which should be nearly zero for low losses) is nearly one ampere. In addition several amperes of direct current to supply power to the circuit must also flow in the same inductor, and this adds to the losses.

In the circuit of FIG. 2, the feed point for the supply power has been moved to the junction of inductor 28 and capacitor 46, at circuit node 39 for the upper PA unit, and similarly at circuit node 40 for the lower PA unit. As the filters formed by inductor 28 and capacitor 46 for the upper PA and inductor 31 and capacitor 47 for the lower PA cause the harmonic content of the transistor waveforms to be removed, the voltages are practically sinusoidal at these nodes 39 and 40. Parallel resonant circuits 27 and 30, in series with the supply leads and attached to these nodes, provide a high impedance to the fundamental frequency, which is the same purpose of the choke 53 in FIG. 3, but do so with substantially smaller inductance values. In a practical case inductor values for the circuits 27 and 30 can be at least ten times smaller than that required in FIG. 3 for choke 53, permitting inductors without ferrite cores (and thus without core losses) to be utilized.

In summary, the novel step of moving the feed for the power supply to nodes with sinusoidal voltages, such as nodes 39 and 40 in FIG. 2, and using parallel resonant circuits in the feed line, permits the use of much smaller inductance values than in the prior art, eliminates the use of ferrite material, and lowers the losses in the circuit, increasing efficiency.

Also in FIG. 3 can be seen, connected across the output at node 55, a parallel resonant circuit 56 and resistor 57. These elements act to absorb energy at frequencies other than the fundamental frequency with the aim of increasing the stability of the PA unit against spurious responses and oscillations; this concept is the subject of co-pending PCT Application No. PCT/US93/03543, Publication No. WO 93/21685, incorporated herein by reference. This same function is novelly and more simply done in FIG. 2 in two different ways. In the upper PA unit 13 stabilization is accomplished by the addition of inductor 26 in series with the positive supply line and the addition of the series resistor and capacitor network 48 from the junction of inductor 26 and resonant circuit 27 to the negative supply line 16 for PA unit 13. This works as follows. The resonant circuit 27 presents a high impedance to the fundamental frequency but passes current at harmonics of the fundamental frequency and other frequencies. This current establishes a voltage across inductor 26, which creates a current in network 48, absorbing power as desired.

In the lower PA unit 18, this stabilization is accomplished by the addition of the parallel combination of inductor 30 and resistor 49 in series with the supply line 17. As does resonant c-1X absorbing power at other than the fundamental frequency, are possible and will be disclosed later in this application.

Referring now to FIG. 4, the novel drive features of the circuit of FIG. 2 may be seen. In the prior art, the amplitude of the signal at the control electrode of the PA unit transistors has been modified to change the output power as shown in FIG. 4a. For a switchmode amplifier design, a threshold voltage 58 is caused to exist, above which the switching transistor (e.g., 25 and 32 in FIG. 2 and 52 in FIG. 3) is ON (highly conducting with very little voltage across it), and below which the switching transistor is OFF (nonconducting with very little current through it).

In practical circuits there is a small range of voltages, called the transition (or switching) region, near threshold voltage 58, which cause intermediate conduction. Since during the time period in which intermediate conduction occurs there is some voltage across the switching transistor at the same time there is current flowing through it, power is lost during this period, and it is usually desirable to make this period as short as possible. In FIG. 4a the period may be adequately short at large drive levels (high output powers) but as the drive level is reduced the fraction of the period during which additional and unacceptable power is consumed in the switching transistor is increased, as the waveform spends more time in the transition region. Note that in FIG. 4a the radio frequency drive signal is centered about the threshold voltage 58; generally the drive signal center is established such that a small but steady current is drawn at zero drive. This is required in most prior art designs to create adequate waveform fidelity at low signal levels.

In the present invention the drive is accomplished in a novel and quite different way. The condition of higher loss at low drive levels is ameliorated by maintaining a high amplitude drive waveform and superimposing a dc level 59 which is varied to change the output power. Because of the high drive amplitude, the waveform passes relatively rapidly through the transition region around the threshold voltage, reducing the time spent in this lossy region. The lower resulting losses cause the amplifier to be more efficient. This is implemented in FIG. 2 by varying the control voltage 37, which becomes, in the circuit of FIG. 2, the equivalent of dc level 59 in FIG. 4. Because of the inherent feedback of the circuit of FIG. 2, the control voltage is closely replicated for the transistor 25. Both transistors 25 and 32 have the same dc current through them and the same voltage across them, and the voltage between their control electrodes and their sources will be nearly the same, in both cases equal to voltage 37. The steady, high amplitude, drive signal shown in FIG. 4b is applied in FIG. 2 at rf terminals 38 and does not vary during operation.

Figure 5:
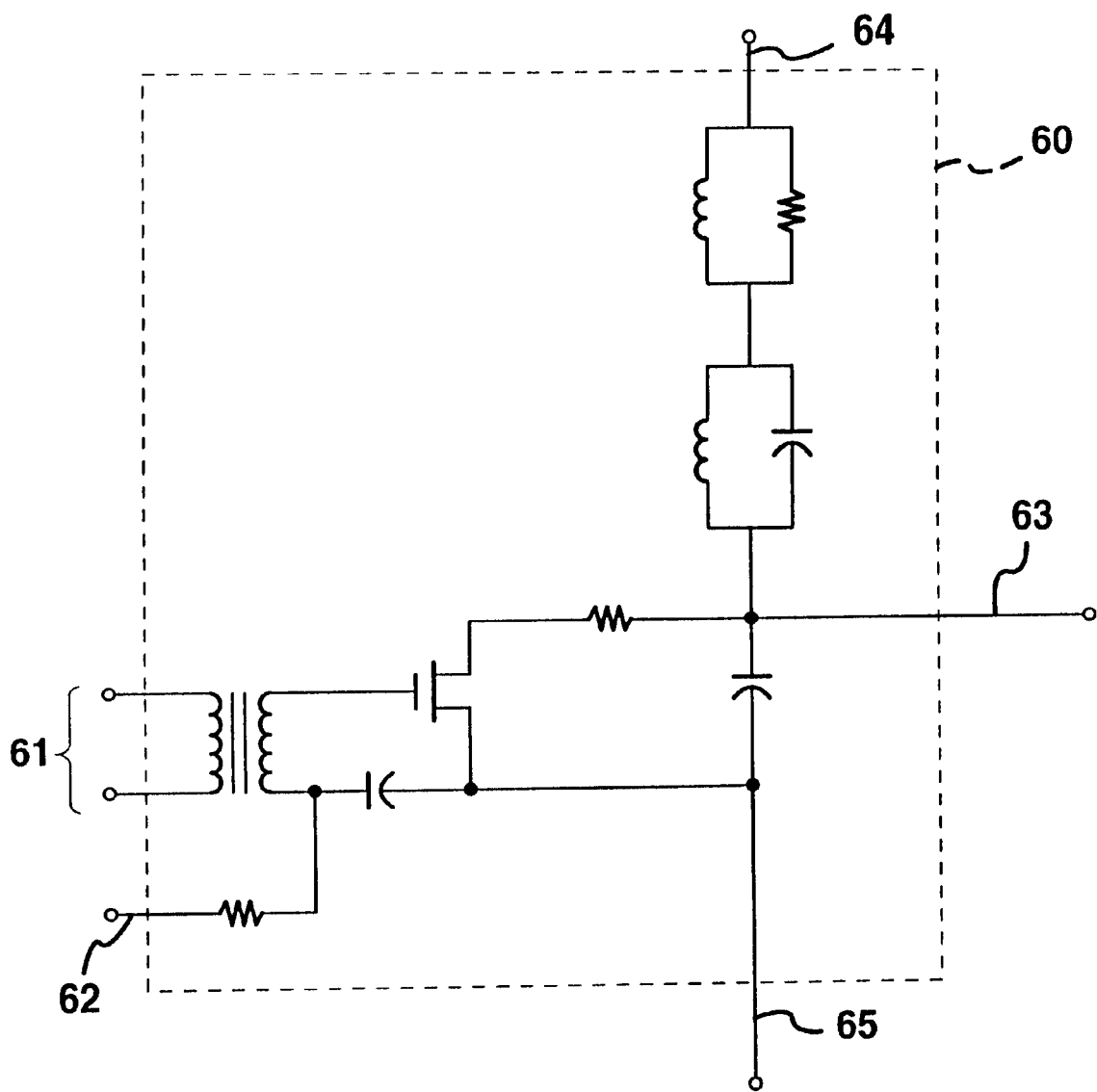
FIG. 5 is a circuit diagram of a typical PA unit as may be incorporated into the current invention.

The concepts outlined in the specific embodiment of FIG. 2 may be generalized in several ways. FIG. 5 shows a diagram of a single PA unit 60 which has radio frequency drive input 61, bias input 62, positive power lead 64, negative power lead 65, and output terminal 63. Eight such units are connected together in accordance with the teachings of this invention in FIG. 6.

Figure 6:
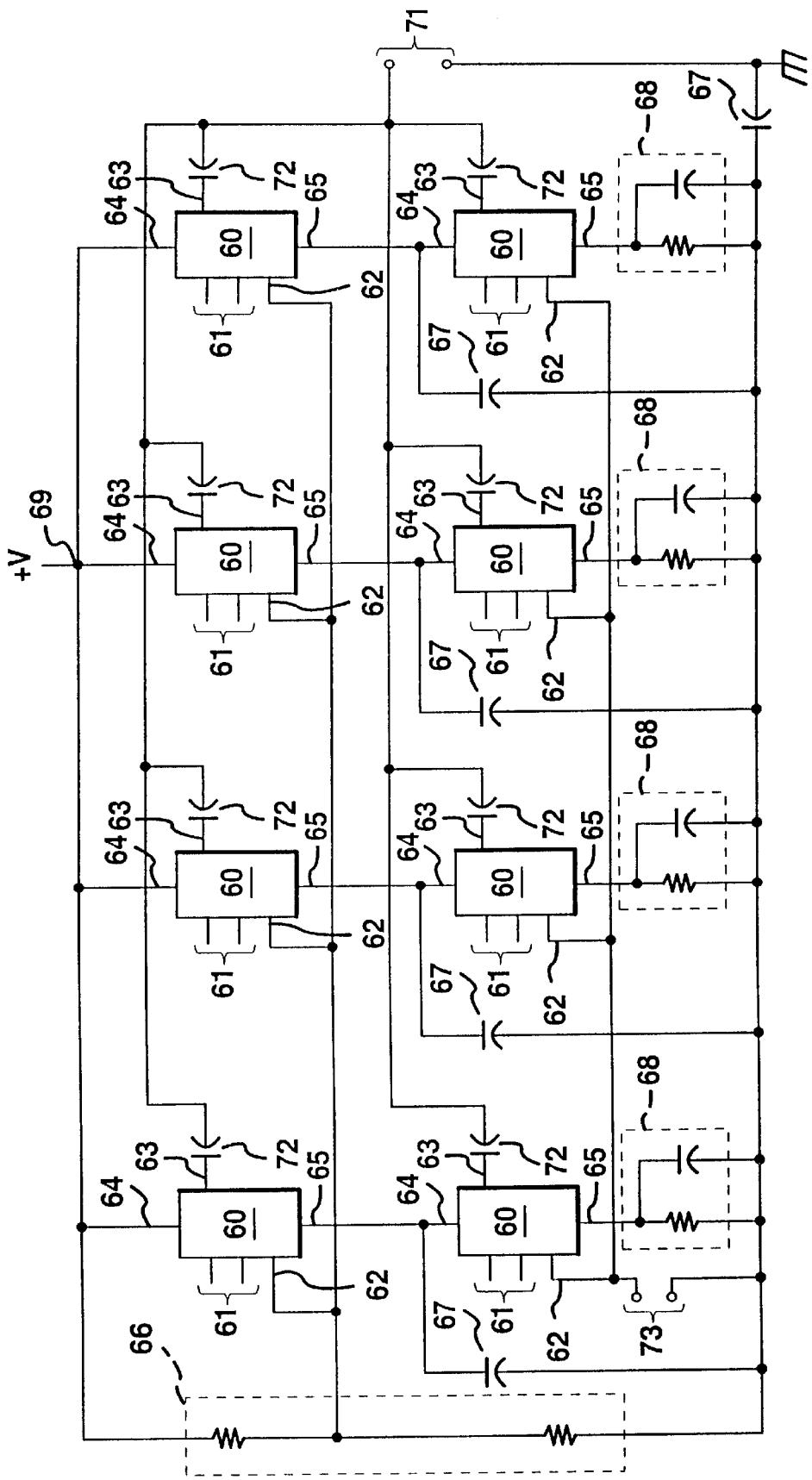
FIG. 6 shows eight PA units in a series/parallel supply voltage arrangement wherein two groups of PA units each have impressed upon them one-half of the power supply voltage.

In analogy with FIG. 2, the power leads of pairs of PA units are connected in series, and these pairs are in turn connected in parallel across the power supply at circuit nodes 69 and 70. In the same manner as has been described in the discussion of FIG. 2, a voltage divider 66 has been provided to create a bias voltage for the upper PA units in FIG. 6; as before the voltage division may be equal or unequal, but typically would be made equal to lower the maximum voltage stress on the PA units. The voltage created by voltage divider 66 is connected to the bias terminals 62 of the upper PA units, and the control voltage 73 is connected to the bias terminals 62 of the lower PA units. As in FIG. 2, a parallel combination 68 of a resistor and a capacitor is placed in series with the lower PA units to minimize the effects of unequal threshold voltages, in a manner which will be familiar to those skilled in the art. Not shown in FIG. 6 is the radio frequency drive circuit; the primaries of the drive inputs 61 for the PA units 60 would be connected in parallel as shown in FIG. 2. Control of the output power in FIG. 6 may be accomplished in the manner shown in FIG. 4 through application of a variable control voltage to terminals 73. The output terminals 63 of the four upper and four lower PA units are connected together through capacitors to the radio frequency output terminal 71. Capacitors 67 are utilized to connect the negative power terminals 65 of the eight PA units to the output common, or ground.

In this manner eight PA units may be connected together to form a high power output having approximately eight times the power of an individual stage, while utilizing a power source having a potential twice that which can be safely placed across any of the individual PA units.

There are yet other ways in which a plurality of PA units may be connected in accordance with the teachings of this invention. FIG. 7 shows eight PA units 60 connected such that only one-fourth of the power supply voltage appears across any one of them. The general similarity of approach to FIG. 6 will be evident to those skilled in the art. In FIG. 7 each of two sets of four PA units are connected in series, and the two sets then connected in parallel. The addition of the parallel combination 68 of a resistor and a capacitor in series with the lowest PA provides a small voltage which subtracts from the bias provided by control voltage 73; this makes the power supply current in each of the two parallel PA sets much less dependent on the exact characteristics of the transistors, and serves to equalize the PA currents. The bias terminals of pairs of these are connected to a voltage divider 74 such that their low frequency impedance is controlled to place one-fourth of the power supply voltage across each of them in the manner heretofore described in the discussion of FIG. 2. Not shown in FIG. 7 is the radio frequency drive circuit; the primaries of the drive inputs 61 for the PA units 60 would be connected in parallel as shown in FIG. 2. Control of the output power in FIG. 7 is accomplished in the manner shown in FIG. 4 through application of a variable bias voltage to terminals 73. The outputs of adjacent PA units are shown connected in parallel through coupling capacitors 72, as was shown in FIG. 6, but in this case the resulting four outputs are combined through a tiered combiner. The upper pair and lower pairs of outputs are combined with transformers 75, producing two outputs in the first tier of combining, indicated as 76. These two outputs are then combined in a second tier with transformer 77. In this manner a single output with the power of all eight PA units is created. The single output common terminal, or ground, is connected, as in FIG. 6, to the negative power terminals of the PA units 60 through capacitors 67, effectively placing all PA units in parallel for radio frequencies.

The eight PA units could have also been combined in a three tier combiner as shown in FIG. 8. Here is shown a plurality 78 of eight PA units being first combined in pairs using combiners 79 in a first tier 80, then the resulting four outputs being combined in pairs using combiners 79 in a second tier 81, and finally the resulting two outputs being combined using combiners 79 in a third and final tier 82 to produce the final output 83. Naturally, the process could be stopped at any point to produce multiple outputs. For example, the final tier 82 could be omitted if two independent outputs were desired—the desired two outputs would be obtained as a result of the combiners 79 in the second tier 81. FIG. 8b shows a particular embodiment of combiner 79, using mutually coupled inductors.

PA devices have internal parasitic elements such as output capacitance and lead inductance. When combined in direct parallel, these parasitic elements can create resonances and instability. A new combiner is proposed which solves the problem. Referring to FIG. 8b, from input to input the inductance of the combiner adds. From combined input to output the inductance cancels or is negligible. Further, some type of dissipation element such as resistor 97 may or may not be included. Resistor 97 could be connected across the inputs to dampen oscillations. Alternatively, or in addition, a lossy inductor could accomplish the same. This combiner can be quite small, taking only ⅛ cubic inches at the kilowatt level. This form of combiner may equalize the currents from each amplifier while simultaneously dampening spurious responses.

FIG. 2 (for the current invention) and FIG. 3 (for the prior art) each show a mechanism for absorbing energy at frequencies other than the fundamental frequency, with the aim of increasing the stability of the PA unit against spurious responses and oscillations. In FIG. 2 this is accomplished by resistors 48 and 49, and in FIG. 3 by resistor 57. It was mentioned above that there were other novel ways of accomplishing this stabilization of the PA array, and one of these is shown in FIG. 9. In FIG. 9, the outputs of a plurality 78 of eight PA units are combined in a tiered combiner consisting of seven combiners 79 in three tiers. A star stabilizer network of resistors 84 is created by connecting one resistor from each of the outputs of the PA units in plurality 78 (after isolation by output capacitors 72) to a common node 85. This acts to stabilize the array of PA units because if any of the PA units creates a signal which is spurious, its output will not be identical to the others, and current will flow in the network of resistors 84, absorbing energy from the system and acting to stabilize it.

In cases where extremely high power is desired, many PA units may be required. Also, as higher powers are achieved, efficiency becomes increasingly important because a small fractional loss of a very large output can be itself substantial and important to minimize. The efficiency of a PA unit can be affected adversely by mistuning of the frequency-determining elements of the PA units. In FIG. 2 these consist of inductor 28 and capacitor 46 for the upper PA unit and inductor 31 and capacitor 47 for the lower PA unit, as well as the parallel resonant power supply feeds 27 and 30. Also, if the frequency of a high power PA array must be variable, each of these must be returned for the unit to operate properly at a new frequency. Tuning such a number of elements simultaneously is difficult and expensive.

In very high power systems, therefore, or in systems wherein a variable frequency is wanted, it would be desirable to have the fewest possible elements required to be variable. FIG. 10 shows a mechanism using the methods of the present invention to create a high power output from a plurality of PA units and yet require only a single tuned circuit be adjusted for high efficiency or for changes in frequency. In FIG. 10, the PA units 86 are reduced to the minimum switch elements and may be non resonant; that is do not have frequency-determining elements. In accordance with the teachings of the present invention, multiple such PA units 86 are connected into two groups, an upper group 87 and a lower group 88, which are connected in series with power source 94 through inductors 89, which act as high impedances at any radio frequency. Resistive divider 90, which would usually be an equal divider, causes, in the manner heretofore described, half of the potential of power source 94 to appear across each of the two groups 87 and 88. It should be noted that in FIG. 10 only two PA units 86 are shown in each of the upper and lower groups, but any number could be connected in parallel in each group to obtain the desired output power. Mutually coupled inductors 96 (as shown n FIG. 8b) may be used to combine pairs of PA units in each of the upper group 87 and the lower group 88 and capacitors 91 are used to connect the upper group 87 and the lower group 88 in parallel at radio frequencies. The resulting power is applied to output 93 after passing through another combiner such as the mutually coupled inductors 96 and then to resonant circuit 92. Resonant circuit 92 is shown as being adjustable, and as this is the only variable element in the circuit, changes in frequency of operation or tuning to obtain maximum efficiency is simple and does not require careful coordination of multiple tuned circuits.

One consequence of combining the techniques disclosed herein is that large numbers of transistor devices can be combined in parallel and series strings. This makes possible variable-frequency solid-state amplifiers capable of power outputs above 100 kW, such as are used in short wave radio broadcast transmitters.

Not shown in FIG. 10 is the radio frequency drive circuit; the primaries of the drive transformers 98 for the PA units 86, if shown, would be connected in parallel in the same manner as the primaries of transformers 34 and 36 in FIG. 2. Control of the output power in FIG. 10 is accomplished in the manner shown in FIG. 4 through application of a variable bias voltage to terminals 95.

A problem mentioned previously is the difficulty of delivering substantial forward power into mismatched loads, particularly into open and short circuits, from generators utilizing fixed voltage power supplies. This is a problem because the characteristics of the load, combined with the fixed high supply voltage, may cause the transistor devices to operate in the linear region, resulting in high power dissipation. To protect the transistors from damage due to this high power dissipation, circuits are usually added to fixed voltage designs to limit the open circuit voltage or short circuit current.

FIG. 11 is a graph of the available forward power from a radio frequency generator into a mismatched load, as a function of the total device dissipation in the generator's transistor devices. As can be seen, the available forward power increases faster than linearly with power dissipation. Increasing the cooling capability of the transistor devices, therefore, allows an unanticipated bonus in available forward power beyond that expected from a linear relationship. Operating at 60, 70, or even about 80 percent of the rated output power may provide advantages. Increasing the actual area of the transistor devices, or equivalently, their number, has been discovered to add more available forward power proportionally than the increase in area. That is, a generator using a larger number of lower power devices will show an improvement in available forward power into a mismatched load as compared to a generator using a smaller number of higher power devices, even if both have the same total power dissipation capability. It is hypothesized that this second effect is due to the increased output capacitance of the former generator as compared to the latter, and that this increased output capacitance acts to reduce the variations in the load impedance as reflected to the transistor devices themselves. Thus it may be possible to increase available forward power output into mismatched loads by the artificial addition of capacitance across the output of the transistor devices, provided this can be done without the insertion of appreciable inductance between the device and the capacitance. This increase in available forward power is important to make it possible to deliver more open circuit voltage or short circuit current than would otherwise be possible with a fixed voltage power source, given the same number of transistors with the same power dissipation ratings in each. This additional ability can be important in plasma powering applications, because ignition of the plasma often requires significant open circuit voltage from the radio frequency generator.

The foregoing discussion and the claims which follow describe the preferred embodiments of the invention. Particularly with respect to the claims it should be understood that changes may be made without departing from their essence. In this regard it is intended that such changes would still fall within the scope of the present invention. It is simply not practical to describe and claim all possible revisions which may be accomplished to the present invention. To the extent such revisions utilize the essence of the invention each would naturally fall within the breadth of protection accomplished by this patent. This is particularly true for the present invention since its basic concepts and understandings are fundamental in nature and can be applied in a variety of ways to a variety of fields.

Furthermore, any references mentioned in the application for this patent as well as all references listed in any information disclosure originally filed with the application are hereby incorporated by reference in their entirety to the extent such may be deemed essential to support the enablement of the invention(s). However, to the extent statements might be considered inconsistent with the patenting of this/these invention(s) such statements are expressly not to be considered as made by the applicant(s).

Finally, in addition, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all action may be expressed as a means for taking that action or as an element which causes that action. Similarly, each physical element disclosed should be understood to encompass a disclosure of the action which that physical element facilitates. Regarding this last aspect, as but one example, the disclosure of an "amplifier" should be understood to encompass disclosure of the act of "amplifying"—whether explicitly discussed or not—and, conversely, were there only disclosure of the act of "amplifying", such a disclosure should be understood to encompass disclosure of an "amplifier." Such changes and alternative terms are to be understood to be explicitly included in the description.

We claim:

1. A method of plasma processing comprising the steps of:
   a) supplying a dc input having a potential;
   b) dividing said potential among a plurality of amplifiers each having a radio frequency output;
   c) supplying a radio frequency drive signal to each of said amplifiers;
   d) superimposing a variable dc level upon said radio frequency drive signal to form a combined signal;
   e) supplying said combined signal to said amplifiers;
   f) varying said dc level;
   g) combining said radio frequency outputs of said amplifiers to create at least one high power, radio frequency output;
   h) creating a plasma through action of said high power, radio frequency output; and
   i) processing using said plasma.

2. A method of plasma processing as described in claim 1 wherein said step of dividing said potential comprises the steps of connecting said plurality of amplifiers in a series string and impressing said potential across said series string.

3. A method of plasma processing as described in claim 2 and further comprising the step of establishing a low frequency impedance for at least one of said plurality of amplifiers causing said potential to be divided at least in part as a result of said low frequency impedance.

4. A method of plasma processing as described in claim 2 or 3 wherein said potential is divided approximately equally among said amplifiers.

5. A method of plasma processing as described in claim 2 wherein said step of dividing said potential further comprises the step of creating at least one bias voltage and providing said bias voltage to at least one of said amplifiers.

6. A method of plasma processing as described in claim 5 wherein said potential is divided approximately equally among said amplifiers.

7. A method of plasma processing as described in claim 1 or 2 wherein at least one of said amplifiers comprises a switchmode-type amplifier.

8. A method of plasma processing as described in claim 1 or 5 wherein said amplifier outputs comprise currents and wherein said step of combining comprises the step of adding said currents from at least two of said amplifiers.

9. A method of plasma processing as described in claim 8 wherein said step of adding comprises the step of totaling said radio frequency currents at a common electrical point.

10. A method of plasma processing as described in claim 1 or 5 wherein said step of combining comprises the step of tiered combining.

11. A method of plasma processing as described in claim 10 wherein said step of tiered combining comprises the steps of:
   a) partitioning said amplifiers into pairs wherein said radio frequency output of each of said amplifiers has a substantially in-phase component;
   b) combining said substantially in-phase components of said radio frequency outputs from each of said amplifiers of said pairs to form a first set of summed outputs each having substantially in-phase output components;
   c) partitioning said first set of summed outputs into at least one pair;
   d) combining said substantially in-phase output components of said first set of summed outputs to form at least one second summed output.

12. A method of plasma processing as described in claim 11 and further comprising the steps of repeating said steps 11 c) and 11 d) wherein said second summed output is considered as a first set of summed outputs, and wherein said steps 11 c) and 11 d) are repeated to achieve said high power, radio frequency output.

13. A method of plasma processing as described in claim 12 wherein said step of repeating continues until a last pair of common electrical points are connected into a final common electrical point.

14. A method of plasma processing as described in claim 11 wherein said step of combining comprises passing said radio frequency outputs through at least one pair of mutually coupled inductors.

15. A method of plasma processing as described in claim 1 wherein said radio frequency drive signal has a constant amplitude.

16. A method of plasma processing as described in claim 1 or 15 wherein said amplifiers have a threshold voltage and wherein said radio frequency drive signal is large compared to said threshold voltage of said amplifiers.

17. A method of plasma processing as described in claim 1 wherein said step of supplying a radio frequency drive signal to each of said amplifiers comprises the steps of:
   a) supplying an input signal at a fundamental frequency to a radio frequency amplifier;
   b) supplying a power supply voltage to said radio frequency amplifier through a power supply feed line;
   c) providing resonant isolation of said power supply feed line at said fundamental frequency;
   d) placing an element in series with said power supply feed line providing high impedance at high frequencies; and
   e) affirmatively absorbing energy from said element at other than said fundamental frequency.

18. A method of plasma processing comprising the steps of:
   a) supplying a dc input having a potential to at least one radio frequency amplifier;
   b) supplying a radio frequency drive signal to said amplifier;
   d) superimposing a variable dc level upon said radio frequency drive signal to form a combined signal;
   e) supplying said combined signal to said amplifiers;
   f) varying said dc level;
   g) operating said amplifier comprising the steps of:
      i) providing a generator having output semiconductor devices to deliver a rated output power into a nominal design load at a particular die temperature for said devices; and
      ii) operating said devices at power levels which permit continual cooling substantially beyond that required to maintain said die temperature at said rated output power into said design load; and
   h) creating a high power, radio frequency output which is responsive to said amplifier;
   i) creating a plasma through action of said high power, radio frequency output; and
   j) processing using said plasma.

19. A method of plasma processing comprising the steps of:
   a) supplying a dc input having a potential to at least one radio frequency amplifier;
   b) supplying a radio frequency drive signal to said amplifier;
   d) superimposing a variable dc level upon said radio frequency drive signal to form a combined signal;
   e) supplying said combined signal to said amplifiers;
   f) varying said dc level;
   g) operating said amplifier comprising the steps of:
      i) providing a generator having output semiconductor devices to deliver a rated output power into a nominal design load at a particular die temperature for said devices; and
      ii) providing an increased output capacitance from said devices; and
   h) creating a high power, radio frequency output which is responsive to said amplifier;
   i) creating a plasma through action of said high power, radio frequency output; and
   j) processing using said plasma.

20. A method of plasma processing comprising the steps of:
   a) supplying a dc input having a potential to at least one radio frequency amplifier;
   b) supplying a radio frequency drive signal to said amplifier;
   d) superimposing a variable dc level upon said radio frequency drive signal to form a combined signal;

e) supplying said combined signal to said amplifiers;

f) varying said dc level;

g) operating said amplifier comprising the steps of:
   i) providing a generator having output semiconductor devices to deliver a rated output power into a nominal design load; and
   ii) blocking reflected power from being transmitted back to said devices; and h) creating a high power, radio frequency output which is responsive to said amplifier;

i) creating a plasma through action of said high power, radio frequency output; and j) processing using said plasma.

21. A method of plasma processing comprising the steps of:

a) supplying a dc input having a potential to at least one radio frequency amplifier;

b) supplying a radio frequency drive signal to said amplifier;

d) superimposing a variable dc level upon said radio frequency drive signal to form a combined signal;

e) supplying said combined signal to said amplifiers;

f) varying said dc level;

g) operating said amplifier comprising the steps of:
   i) providing a generator having output semiconductor devices to deliver a rated output power into a nominal design load; and
   ii) limiting the continuous operation of said devices to power levels which are 80 percent of said rated output power of said devices; and h) creating a high power, radio frequency output which is responsive to said amplifier;

i) creating a plasma through action of said high power, radio frequency output; and j) processing using said plasma.

22. A plasma processing system comprising:

a) a source of power having a dc potential;

b) at least one driver supplying a radio frequency drive signal;

c) a variable dc level circuit;

d) combining circuitry responsive to said radio frequency drive signal and said variable dc level circuit and which forms a combined signal;

e) a plurality of power amplifiers responsive to said radio frequency drive signal, said plurality of amplifiers connected whereby across each of said amplifiers is impressed less than said potential;

f) combining circuitry responsive to at least two of said amplifiers having at least one output;

g) at least one electromagnetic coupling element, connected to said output; and h) at least one plasma element connected to said electromagnetic coupling element.

23. A plasma processing system as described in claim 22 wherein said plurality of power amplifiers are connected in a series string and said dc potential is impressed across said series string.

24. A plasma processing system as described in claim 23 wherein said amplifiers have a low frequency impedance causing said potential to be divided among said amplifiers.

25. A plasma processing system as described in claim 23 or 24 wherein said potential is divided approximately equally among said amplifiers.

26. A plasma processing system as described in claim 23 and further comprising a bias voltage supply which controls a division of said dc potential among said power amplifiers.

27. A plasma processing system as described in claim 26 wherein said potential is divided approximately equally among said amplifiers.

28. A plasma processing system as described in claims 22 or 23 wherein at least one of said amplifiers comprises a switchmode-type amplifier.

29. A plasma processing system as described in claim 22 or 26 wherein each of said amplifiers has an output comprising a current and wherein said combining circuitry comprises an electrical network arranged to add said currents from at least two of said amplifiers.

30. A plasma processing system as described in claim 29 wherein each of said amplifiers has an output and wherein said combining circuitry comprises at least one series electrical element connected between each of said outputs of said amplifiers and a common electrical point.

31. A plasma processing system as described in claim 30 wherein said at least one electrical element comprises an inductor, capacitor, or resistor.

32. A plasma processing system as described in claim 22 wherein said combining circuitry comprises at least one tiered combiner.

33. A plasma processing system as described in claim 32 wherein said plurality of amplifiers comprise at least four amplifiers each having radio frequency outputs, said outputs having a phase, wherein said amplifiers are paired, and wherein said tiered combiner comprises:

a) a plurality of first order connections between each pair of said amplifiers acting to combine substantially in-phase components of said radio frequency outputs from said amplifiers so as to produce an output having a phase; and b) at least one second order connection responsive to and acting to combine substantially in-phase components of said output from at least two of said first order connections.

34. A plasma processing system as described in claim 22 wherein said radio frequency drive signal has a constant amplitude.

35. A plasma processing system as described in claim 22 or 34 wherein said power amplifiers have a threshold voltage and wherein said radio frequency drive signal is large compared to said threshold voltage of said power amplifiers.

36. A plasma processing system as described in claim 22 and further comprising:

a. a power supply supplying a voltage to a power supply feed line of said power amplifiers;

b. a resonant isolation circuit providing isolation of said power supply feed line at said fundamental frequency;

c. a series element in series with said power supply feed line providing high impedance at high frequencies; and d. at least one loss component which affirmatively absorbs energy from said element at other than said fundamental frequency.

37. A plasma processing system comprising:

a) a source of power having a dc potential;

b) at least one driver supplying a radio frequency drive signal;

c) a variable dc level circuit;

d) combining circuitry responsive to said radio frequency drive signal and said variable dc level circuit and which forms a combined signal;

e) at least one power amplifiers responsive to said radio frequency drive signal comprising:
   i) a generator having output semiconductor devices to deliver a rated output power into a nominal design load at a particular die temperature for said devices; and
   ii) an increased cooling capability for said devices which permits continual cooling substantially beyond that required to maintain said die temperature at said rated output power into said design load; and
f) at least one plasma element responsive to said amplifier.

38. A plasma processing system comprising:
a) a source of power having a dc potential;
b) at least one driver supplying a radio frequency drive signal;
c) a variable dc level circuit;
d) combining circuitry responsive to said radio frequency drive signal and said variable dc level circuit and which forms a combined signal;
e) at least one power amplifiers responsive to said radio frequency drive signal comprising:
   i) a generator having output semiconductor devices to deliver a rated output power into a nominal design load at a particular die temperature for said devices; and
   ii) an increased output capacitance added across the output of said devices beyond that otherwise required to be designed into said generator; and
f) at least one plasma element responsive to said amplifier.

39. A plasma processing system comprising:
a) a source of power having a dc potential;
b) at least one driver supplying a radio frequency drive signal;
c) a variable dc level circuit;
d) combining circuitry responsive to said radio frequency drive signal and said variable dc level circuit and which forms a combined signal;
e) at least one power amplifiers responsive to said radio frequency drive signal comprising:
   i) a generator having output semiconductor devices to deliver a rated output power into a nominal design load at a particular die temperature for said devices; and
   ii) a blocking element which blocks any reflected power from being transmitted back to said devices; and
f) at least one plasma element responsive to said amplifier.

40. A plasma processing system comprising:
a) a source of power having a dc potential;
b) at least one driver supplying a radio frequency drive signal;
c) a variable dc level circuit;
d) combining circuitry responsive to said radio frequency drive signal and said variable dc level circuit and which forms a combined signal;
e) at least one power amplifiers responsive to said radio frequency drive signal comprising:
   i) a generator having output semiconductor devices to deliver a rated output power into a nominal design load at a particular die temperature for said devices; and
   ii) a power limiter which limits the continuous operation of said devices to power levels which are 80 percent of said rated output power of said devices; and
f) at least one plasma element responsive to said amplifier.

* * * * *